United States Patent [19]

Banba et al.

[11] Patent Number: 5,070,604
[45] Date of Patent: Dec. 10, 1991

[54] METHOD FOR SOLDERING TWO KINDS OF PARTS ON ONE-SIDE PRINTED BOARD

[75] Inventors: Mitsuyuki Banba; Hideki Matsuo, both of Kanagawa; Yasuo Nakayama; Hideo Suzuki, both of Chiba, all of Japan

[73] Assignee: Sony Corporation, Tokyo, Japan

[21] Appl. No.: 629,140

[22] Filed: Dec. 18, 1990

[30] Foreign Application Priority Data

Dec. 28, 1989 [JP] Japan .................................. 1-342710

[51] Int. Cl.$^5$ .............................................. H05K 3/30
[52] U.S. Cl. ........................................ 29/837; 29/840; 228/136
[58] Field of Search ............... 29/837, 840; 228/180.1, 228/136

[56] References Cited

U.S. PATENT DOCUMENTS

| 4,506,443 | 3/1985 | Itoh | 29/840 |
| 4,515,304 | 5/1985 | Berger | 228/136 |
| 4,761,881 | 8/1988 | Bora et al. | 29/840 |
| 4,982,376 | 1/1991 | Megens et al. | 29/840 X |

Primary Examiner—Carl J. Arbes
Attorney, Agent, or Firm—Philip M. Shaw, Jr.

[57] ABSTRACT

The present invention relates to a method for soldering two kinds of parts, parts with leads and chip parts, on one-side printed board, comprising coating a cream solder on a plurality of points of a wiring pattern surface of one-side printed board and coating an adhesive for adhering parts with leads on a non-wiring pattern, adhering parts with leads to said non-wiring pattern surface by said adhesive, passing leads of the parts with leads through lead insert holes of said one-side printed board to insert the same into one cream solder on the wiring pattern surface from the side of the non-wiring pattern surface, mounting chip parts on the other cream solder on said wiring pattern surface, thereafter heating at once the whole cream solder on the wiring pattern to simultaneously reflow-solder the parts with leads and chip parts whereby the parts with leads and the chip parts can be simultaneously soldered by a single reflow soldering step.

3 Claims, 3 Drawing Sheets

FIG. IA
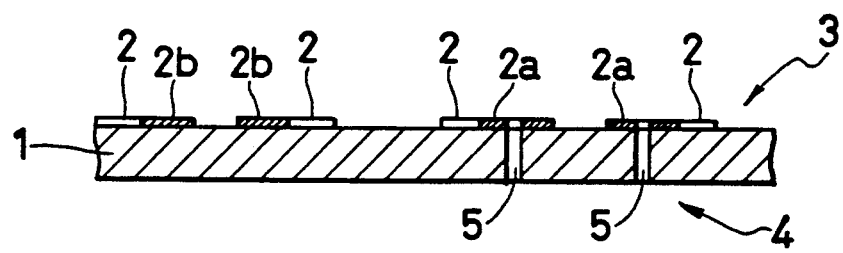
FIG. IB
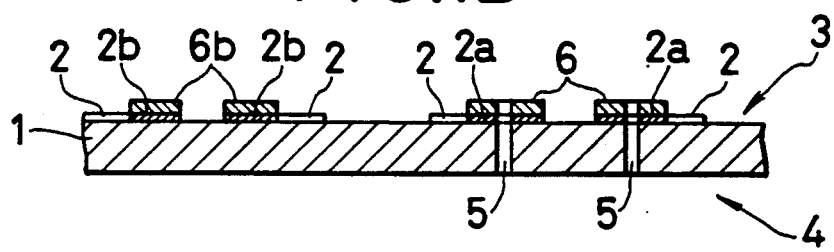
FIG. IC
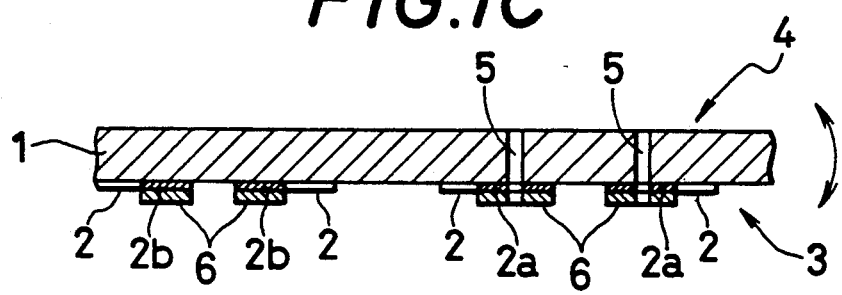
FIG. ID
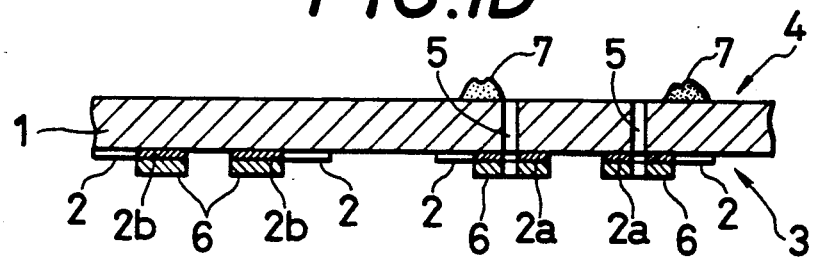
FIG. IE
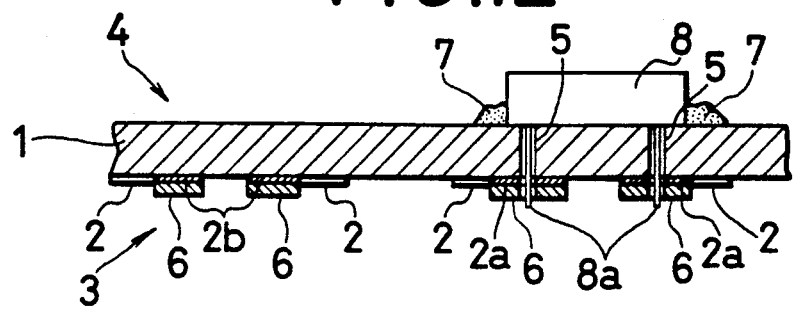

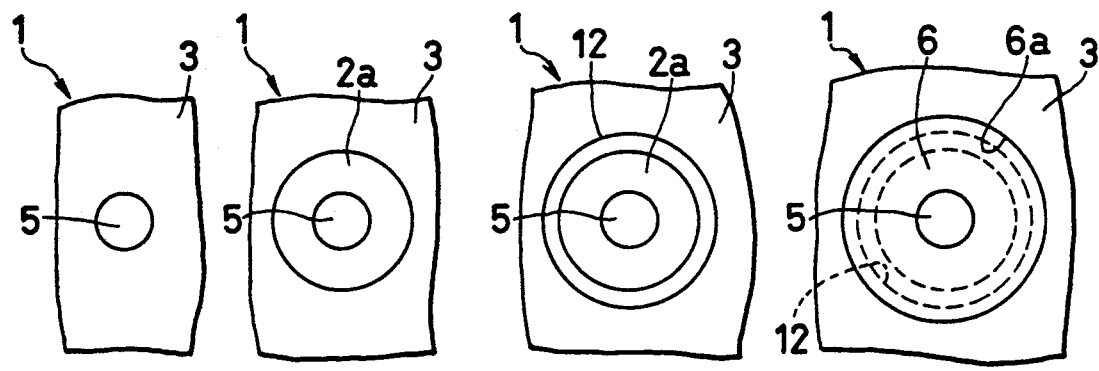
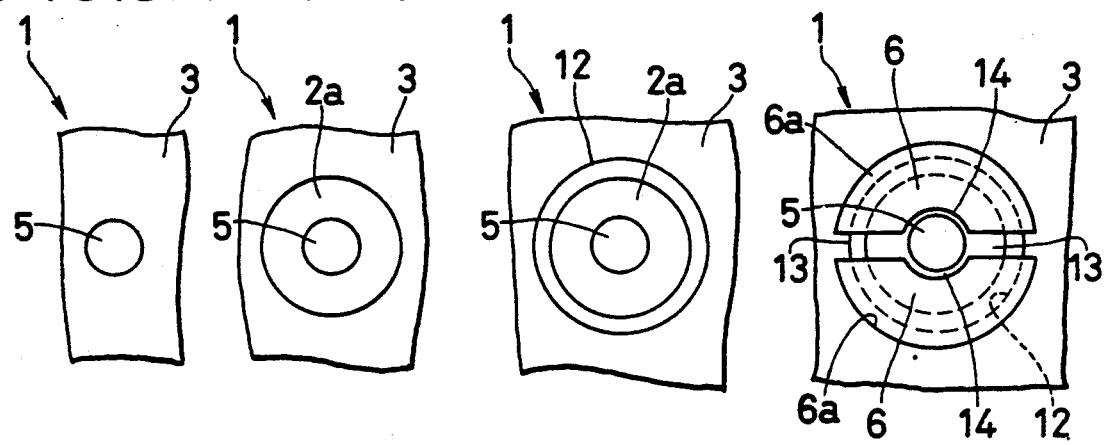
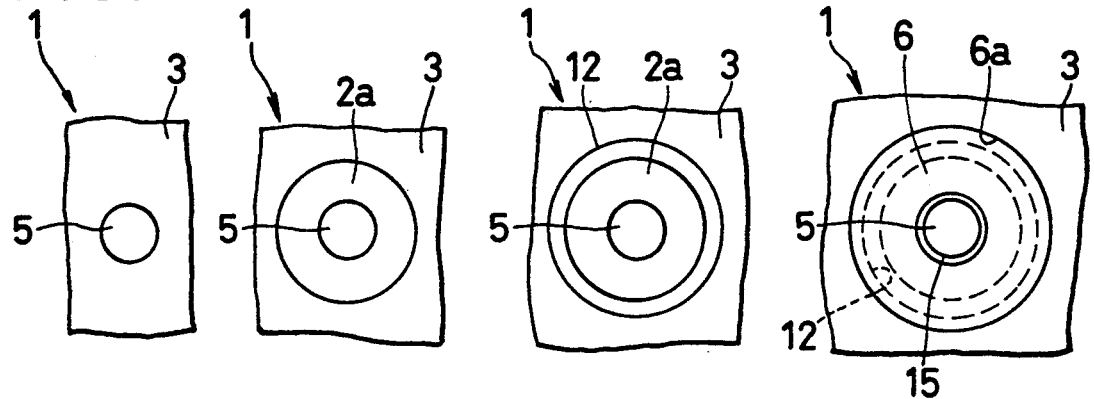

METHOD FOR SOLDERING TWO KINDS OF PARTS ON ONE-SIDE PRINTED BOARD

BACKGROUND OF THE INVENTION

Field of the Invention

The present invention relates to a method for soldering two kinds of parts, parts with leads and chip parts, on one-side printed board.

Description of the Prior Art

Recently, a surface mounting method for chip parts onto a printed board has been rapidly progressed. However, in parts with leads such as connectors, switches and the like, leads thereof to be soldered have to be inserted into lead insert holes of the printed board.

Conventional methods for soldering two kinds of parts, parts with leads and chip parts, onto one-side printed board include the following:

A. Method for First Carrying Out One-side Dip

A method which comprises inserting a lead of a part with a lead into one-side printed board to solder-dip the same, coating a cream solder on the one-side printed board to mount a chip part, and locally soldering the cream solder by soldering through a laser, a spot air reflow, or manual operation.

B. Method for First Carrying Out Reflow Soldering

A method which comprises coating a cream solder on one-side printed board and mounting a chip part, carrying out reflow soldering, inserting a lead of a part with a lead into the one-side printed board, coating the cream solder on the lead, and carrying out local reflow soldering using a spot air reflow or the like or carrying out local soldering by manual operation.

However, the aforementioned conventional methods have the following problems.

In both the methods A and B, even locally, the one-side printed board is heated twice or more and therefore the one-side printed board receives an extremely great heat stress, and the one-side printed board tends to be thermally damaged. In addition, a heat resistant printed board is very expensive.

For both the methods A and B, two or more soldering steps are required. Particularly, in case of local soldering, exclusive-use equipment has to be provided, increasing equipment cost and maintenance cost. Furthermore, manual soldering is extremely poor in workability.

The method A requires a cream solder coater for exclusive use for chip parts. The method B requires a cream solder coater for exclusive use for parts with leads. Accordingly, when a board is changed, programs for these exclusive-use cream solder coaters need be changed.

In the method A, since the solder dipping is carried out, a solder bridge tends to occur.

In the method B, when the whole one-side printed board is subjected to reflow soldering by the second soldering, heating has to be made at a temperature lower than a heating temperature used at the time of the first reflow soldering, lowering a reliability of soldering. Moreover, since theremal stress is given to the first soldered portion during the second soldering, the reliability of the first soldered portion is also degraded.

OBJECTS OF THE INVENTION

A method for soldering two kinds of parts, parts with leads and chip parts, on one-side printed board according to the present invention comprises the steps of coating a solder on a plurality of points of a wiring pattern of said one-side printed board; coating an adhesive for adhering parts with leads on a non-wiring pattern surface of said one-side printed board; adhering the parts with leads on the non-wiring pattern surface of said one-side printed board by said adhesive and passing the leads of said parts with leads through lead insert holes of said one-side printed board to insert them into one cream solder of the wiring pattern surface from the side of the non-wiring pattern surface; mounting chip parts on the other cream solder on the wiring pattern surface of of said one-side printed board; and heating for once the whole cream solder on the wiring pattern of said one-side printed board to simultaneously reflow-solder said parts with leads and said chip parts.

A first object of the present invention is to simultanesouly solder parts with leads and chip parts on one-side printed board by a single reflow soldering step.

A second object of the present invention is to apply a single beating step of one-side printed board in soldering parts with leads and chip parts on the one-side printed board to thereby materially reduce a thermal stress received by the one-side printed plate to prevent the one-side printed plate from being damaged by heat.

A third object of the present invention is not to require a heat resistant and expensive printed board but use an inexpensive printed board.

A fourth object of the present invention is to reduce equipment cost and maintenance cost disusing an exclusive-use locally soldering device, a cream solder coating device for exclusive use for parts with leads and the like and improve workability disusing manual soldering.

A fifth object of the present invention is to simplify mounting step to make maintenance easy and reduce maintenance cost.

A sixth object of the present invention is to easily change one-side printed board, as necessary, disusing an exclusive-use locally soldering device, a cream solder caoting device for exclusive use for parts with leads and the like.

A seventh object of the present invention is to carry out soldering by reflow to minimize occurrence of solder bridge such as solder dip.

An eighth object of the present invention is to apply a single soldering step by heating a cream solder to minimize a thermal stress applied to a soldered portion so as to improve a reliability of soldering.

A ninth object of the present invention is to use a ultraviolet curing type adhesive as an adhesive for parts with leads to one-side printed board so that the parts with leads can be simply and quickly adhered to the one-side printed board so as not to impart a thermal stress or the like to the one-side printed board.

BRIEF DESCRIPTION OF THE DRAWINGS

FIGS. 1(A), 1(B), 1(C), 1(D), 1(E), 1(F), 1(G), 1(H) and 1(I) are respectively sectional views for explaning a soldering method; and FIGS. 2(A), 2(B), 2(C) and 2(D), FIGS. 3(A), 3(B), 3(C) and 3(D) and FIGS. 4(A), 4(B), 4(C) and 4(D) are respectively plan views for explaining a cream solder coating method.

DETAILED DESCRIPTION OF A PREFERRED EMBODIMENT

Figure 1F:
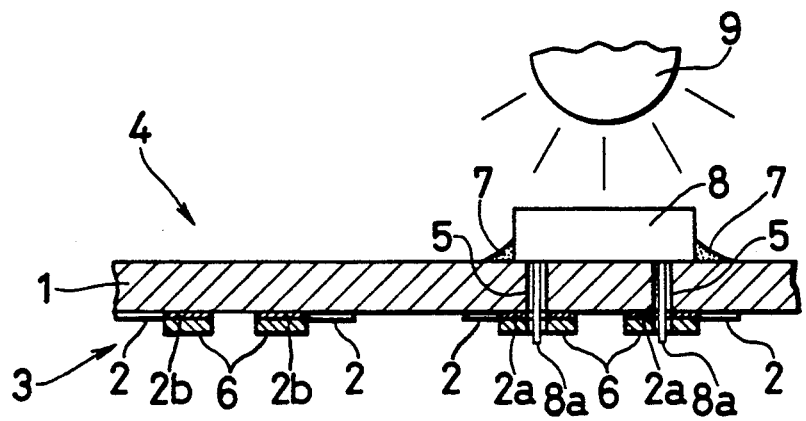

One embodiment of a method for soldering two kinds of parts on one-side printed board according to the present invention will be described hereinafter with reference to the drawings.

First, FIG. 1(A) shows one-side printed board 1. The printed board 1 has an upper surface constituted by a wiring pattern surface 3 formed with a wiring pattern 2 printed wired electric conductive elements such as copper foils and a lower surface constituted by a non-wiring pattern surface 4 not formed at all with the wiring pattern surface 2. In a central portion of a predetermined land portion 2a among a plurality of land portions 2a and 2b of the wiring pattern 2 are provided a plurality of lead insert holes 5 which extend through between the wiring pattern surface 3 and the non-wiring pattern surface 4 of the one-side printed board 1.

The soldering method will be sequentially explained hereinafter.

First, as shown in FIG. 1(B). the wiring pattern surface 3 of the one-side printed board 1 is directed at the upper surface. A cream solder 6 is coated for once on the plurality of land portions 2a and 2b of the wiring pattern 2 by a solder cream soldering method or the like.

Next, as shown in FIG. 1(C), the one-side printed board 1 is inverted up-side down, and the non-wiring pattern surface 4 is directed at the upper side.

Then, as shown in FIG. 1(D), an adhesive 7 such as ultraviolet curing type adhesives is coated on the designated position such as positions in the vicinity of said plurality of lead insert holes 5 on the non-wiring pattern surface 4 of the one-side printed board 1.

Next, as shown in FIG. 1(E), a part with a lead such as a connector, a switch or the like is adhered by said adhesive onto the non-wiring pattern surface 4 of the one-side printed board 1. At this time, a plurality of leads 8a of the part with a lead 8 are inserted into the plurality of lead insert holes 5 and inserted into the cream solder 6 on the predetermined land portion 2a of the wiring pattern surface 3 from the side of the non-wiring pattern surface 4.

Then, as shown in FIG. 1(F), the adhesive 7 such as ultraviolet curing type adhesive is cured by adhesive curing means 9 such as a ultraviolet curing furnace to fix the part with a lead 8 to the non-wiring pattern surface 4 of the one-side printed board 1.

Figure 1G:
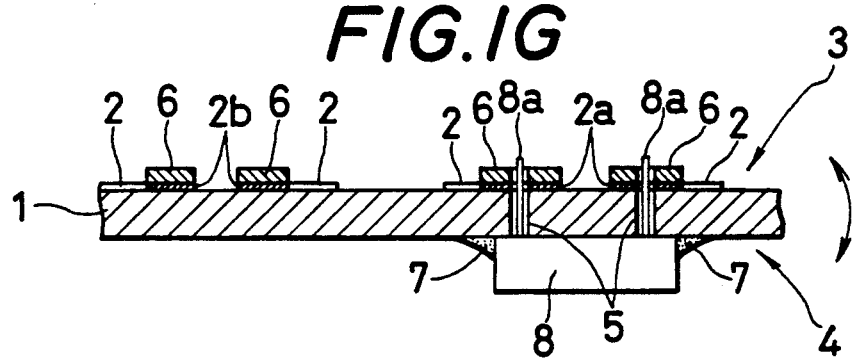

Next, as shown in FIG. 1(G), the one-side printed board 1 is inverted up-side down to again direct the wiring pattern surface 3 at the upper side.

Figure 1H:
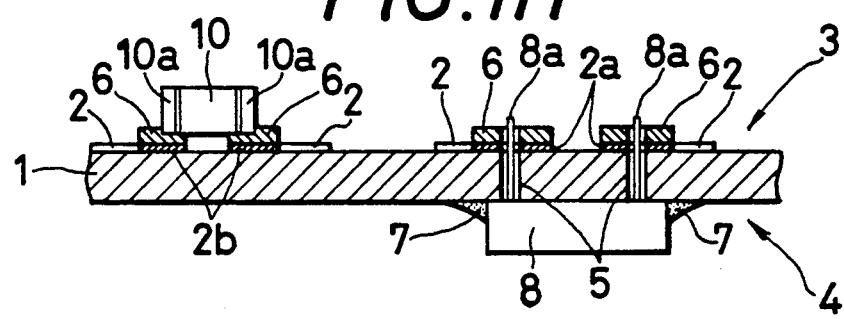

Then, as shown in FIG. 1(H), a plurality of terminals 10a of a chip part 10 such as a solder dip disable chip part such as QFP-IC between narrow-pitched terminals are mounted by light pressing on the cream solder on the other land portion 2b of the wiring pattern surface 3 of the one-side printed board 1.

Figure 1I:
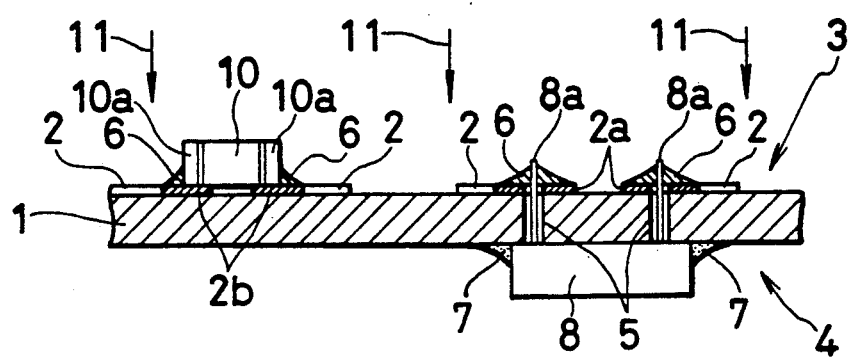

Finally, as shown in FIG. 1(I), the whole cream solder 6 on the wiring pattern surface 3 of the one-side printed board 1 is heated for once for tens seconds by a reflow means 11 such as high temperature air at 200° C. or so. Then, the plurality of leads 8a of the part with a lead 8 and the plurality of terminals 10a of the chip part 10 are simultaneously reflow-soldered on the designated land portions 2a and 2b of the wiring pattern 2, thus completing a series of soldering steps.

In the coating step by printing the cream solder 6 shown in FIG. 1(B), an amount of supply of the cream solder 6 to be coated on the land portion 2a in the outer periphery of the lead insert hole 5 for soldering the lead 8a is smaller than that of the dispenser system. It is therefore preferred that the amount of supply of the cream solder 6 is secured by the method shown in FIG. 2.

That is, in FIG. 2, reference numeral 5 designates a lead insert hole; 2a a circular land portion; 12 a resist print shape having an inner diameter larger than an outer diameter of the land portion 2a; and 6a a cream solder print shape having an inner diameter larger than an inner diameter of the resist print shape. When all these portions are placed one over another, a shape shown in FIG. 2(D) is formed. Accordingly, the cream solder 6 is to be printed on the inside of the cream solder print shape 6a, and a sufficient amount of supply of the cream solder 6 can be secured.

FIGS. 3 and 4 show a print shape in which the cream solder 6 is not moved into the lead insert hole 5. First, in FIG. 3(D), the cream solder print shape 6a is divided into two semi-circular sections so that non-print spaces 13 and 14 are formed therebetween and in the outer periphery of the lead insert hole 5. In FIG. 4(D), a non-print space 15 is formed in the central portion of the cream solder print shape 6a and in the outer periphery of the lead insert hole 5.

Although the present invention has been shown and described with respect to preferred embodiments, various changes and modifications which are obvious to a person skilled in the art to which the invention pertains are deemed to lie within the spirit and scope of the invention.

What is claimed is:

1. A method for soldering two kinds of parts, parts with leads and chip parts, on a circuit board of the type having a wiring pattern printed on a first side of the circuit board and no printed wiring pattern on the opposite, second side of the circuit board, comprising the steps of:

coating a cream solder on a plurality of points of the printed wiring pattern on the first side of the circuit board;

coating an adhesive for adhering parts with leads on the second side of the circuit board;

adhering parts with leads only to the second side of the circuit board by the adhesive and passing the leads into lead insert holes of the circuit board from the second side of the circuit board to insert the leads into selected printed circuit pattern points covered with the cream solder on the first side of the circuit board;

mounting chip parts by means of the cream solder on the wiring pattern only on the first side of the circuit board; and heating all at once all of the cream solder on the wiring pattern of the circuit board to simultaneously reflow-solder the parts with leads and the chip parts.

2. The method according to claim 1, wherein the adhesive comprises an ultraviolet curing type adhesive.

3. The method according to claim 1, wherein in the step of coating the cream solder, the circuit board is arranged so that first side of the circuit board assumes the upper side; in the step of coating the adhesive and the step of carrying out adhering the parts with leads and inserting the leads into the lead insert holes, the circuit board is arranged so that second side of the circuit board assumes the upper side; and in the step of mounting the chip parts and the step of carrying out the reflow soldering, the circuit board is arranged so that first side of the circuit board assumes the upper side.

* * * * *